United States Patent [19]

Bremer et al.

[11] Patent Number: 5,671,250

[45] Date of Patent: Sep. 23, 1997

[54] AUTORATE METHOD FOR SIMULTANEOUS TRANSMISSION OF VOICE DATA

[75] Inventors: Gordon Bremer; Kenneth David Ko, both of Clearwater; Luke J. Smithwick, New Port Richey; Edward Sigmund Zuranski, Largo, all of Fla.

[73] Assignee: Paradyne Corporation, Largo, Fla.

[21] Appl. No.: 352,297

[22] Filed: Dec. 8, 1994

Related U.S. Application Data

[63] Continuation of Ser. No. 76,525, Jun. 14, 1993, abandoned.

[51] Int. Cl.$^6$ .................................................. H04L 5/16
[52] U.S. Cl. ............................ 375/222; 375/377; 375/216; 370/465
[58] Field of Search ........................ 375/8, 7, 76, 121, 375/219, 216, 222, 316, 340, 377, 346; 370/32, 84, 465, 468; 379/96, 97, 100; 358/405, 406

[56] References Cited

U.S. PATENT DOCUMENTS

| | | | |
|---|---|---|---|
| 4,512,013 | 4/1985 | Dash et al. | 370/69.1 |
| 4,756,007 | 7/1988 | Qureshi et al. | 375/37 |
| 4,757,495 | 7/1988 | Decker et al. | 370/76 |
| 4,953,180 | 8/1990 | Fieschi et al. | 375/8 X |
| 4,956,851 | 9/1990 | Wolensky et al. | 375/8 |
| 4,989,221 | 1/1991 | Qureshi et al. | 375/8 |
| 4,991,184 | 2/1991 | Hashimotoo | 375/8 |
| 5,007,047 | 4/1991 | Sridhar et al. | 370/32.1 |
| 5,081,647 | 1/1992 | Bremer | 375/5 |
| 5,199,046 | 3/1993 | Ling | 375/8 |
| 5,410,599 | 4/1995 | Crowley et al. | 380/9 |

FOREIGN PATENT DOCUMENTS

| 0653873 | 2/1994 | European Pat. Off. | H04M 11/06 |
|---|---|---|---|

OTHER PUBLICATIONS

Fujiya et al, "Variable—Rate Voice Communications Using ADPCM in ATM Network" Communications, 1991 IEEE International Conf. pp. 1713–1717.

Morello, "Flash—IV: A Flexable Bit–Rate Transmission System for Digital HDTV Outside Broadcasting by Satellite". GlobeCom '93 : IEEE Global Telecommunications Conf. pp. 1622–1627.

Primary Examiner—Tesfaldet Bocure
Assistant Examiner—Bryan Webster
Attorney, Agent, or Firm—Thomas, Kayden, Horstemeyer & Risley, LLP

[57] ABSTRACT

In a simultaneous voice and data communications system comprising two modems, an autorate feature is implemented in one illustrative method by adding a silence detector to the receiver circuitry of at least one of the modems in such a way that noise statistics for the communications channel are only accumulated during intervals of silence. If the resulting noise statistics exceed a predetermined threshold, i.e., the communications channel is too noisy, the receiving modem negotiates a lower data rate with the transmitting modem. In another illustrative method, the transmitting modem provides a signal, which represents an interval of silence, to the receiving modem. Upon receipt of the signal, the receiving modem accumulates error statistics in order to determine if the communications channel is too noisy.

21 Claims, 3 Drawing Sheets

5,671,250

AUTORATE METHOD FOR SIMULTANEOUS TRANSMISSION OF VOICE DATA

This application is a continuation of application Ser. No. 08/076,525, filed on Jun. 14, 1993, abandoned.

BACKGROUND OF THE INVENTION

The present invention relates to data communications equipment, e.g., modems. In particular, this invention relates to the transmission of both voice and data signals over the same communications facility at the same time.

A standard feature in most modems today is the "autorate" feature. In particular, each modem of a data connection continually tests the quality of the communications channel to adjust the data transmission rate, i.e., the bit rate, between the modems. For example, if the data signal begins to experience an increase in errors, i.e., a higher error rate, then the modems will negotiate a lower data rate between themselves. Conversely, if over a period of time the error rate is lower than a predetermined threshold, the modems will negotiate a higher data rate between themselves.

A number of prior art autorating techniques are illustrated in U.S. Pat. No. 4,756,007 issued Jul. 5, 1988 to Qureshi et al.; U.S. Pat. No. 4,991,184 issued Feb. 5, 1991 to Hashimoto; and U.S. Pat. No. 5,007,047 issued Apr. 9, 1991 to Sridhar et al. Generally speaking, the prior art approach operates in the following manner. The receiving modem performs a "slicing" operation on each received signal point. This slicing operation simply estimates the closest symbol to the received signal point from a known constellation of symbols. This is known also as a "hard decision." The magnitude of the deviation of the received signal point from the closest symbol is assumed to be proportional to the ambient noise condition of the communications channel. When the ambient noise condition of the channel exceeds in either direction a set of predetermined limits, the modems negotiate between themselves a change in the data rate to accommodate the estimated ambient noise of the communications channel.

The co-pending, commonly assigned, U.S. patent application of Gordon Bremer and Kenneth D. Ko, entitled "Simultaneous Analog and Digital Communication," Ser. No. 08/076,517, filed Jun. 14, 1993, which is hereby incorporated by reference, discloses a simultaneous voice and data communication system in which a voice signal is simultaneously added to a data signal for transmission over a communications channel to a receiving modem. Generally, in each signaling interval, T, the data signal is represented by a data symbol, which is a reference signal point value. To this data symbol is added a voice signal vector, which represents the voice signal. The addition of the voice signal vector to the data symbol results in a signal point being selected that is a function of both the data signal and the voice signal in each signaling interval T.

Unfortunately, since the selected signal point is different from the selected data symbol, the prior-art method of autorating results in the receiving modem erroneously computing an error signal that is proportional to the transmitted voice signal and not the ambient noise of the communications channel. Consequently, the prior-art method of autorating is ineffective in a simultaneous voice and data communications system.

SUMMARY OF THE INVENTION

In accordance with the invention, an autorating method and apparatus is disclosed in which the evaluation of ambient noise on a communications channel only occurs during silent periods of the voice signal. When a silent period is detected, noise statistics of the communications channel are then collected.

In a simultaneous voice and data communications system comprising two modems, an autorate feature is implemented in one illustrative embodiment by adding a silence detector to the receiver circuitry of at least one of the modems. The silence detector provides an enabling signal in such a way that noise statistics are only accumulated during intervals of silence. If the resulting noise statistics exceed a predetermined threshold, e.g., the communications channel is too noisy, the receiving modem negotiates a lower data rate with the transmitting modem. Conversely, if the resulting noise statistics are lower than a predetermined threshold, the receiving modem negotiates a higher data rate with the transmitting modem.

In another embodiment of the invention, a transmitting modem provides the enabling signal to the receiving modem during periods of silence. In particular, the enabling signal is a control message passed to the receiving modem on a secondary communications channel. In response to receiving the enabling signal, the receiving modem then accumulates error statistics in order to determine whether to change the data rate over the communications channel.

DETAILED DESCRIPTION

Figure 1:
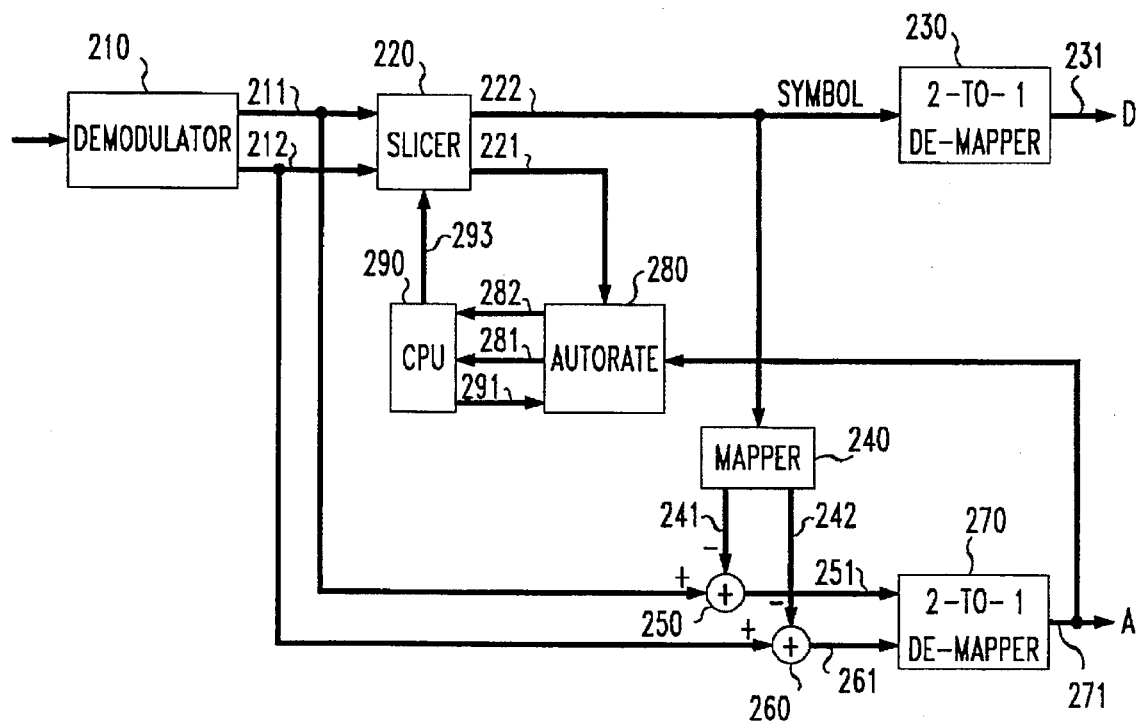
FIG. 1 shows a receiver embodying the principles of the invention.

An embodiment of the inventive concept is shown in FIG. 1. As disclosed in the above-mentioned co-pending patent application a modulated simultaneous voice and data input signal is received from a communications channel and applied to demodulator 210 which develops the in-phase and quadrature components. Those are applied to slicer 220, which identifies the symbols, i.e., maps the received signal point to the closest data symbol from the currently selected symbol constellation (not shown). It is assumed that slicer 220 stores a number, or set, of symbol constellations, of which one symbol constellation is the currently selected constellation, which is controlled by CPU 290 (discussed below). Slicer 220 provides the identified symbols to 2-to-1 de-mapper 230. In addition, FIG. 1 includes 1-to-2 mapper 240 that is responsive to the symbols developed by slicer 220. The output of mapper 240 is a set of in-phase and quadrature components for the identified symbols. The outputs of mapper 240 are subtracted from the outputs of demodulator 210 in subtractors 250 and 260 to provide a pair of analog samples on lines 251 and 261. These outputs are applied to 2-to-1 de-mapper 270, which recombines the analog samples to form the original analog signal, e.g., a voice signal, on line 271.

Figure 2:
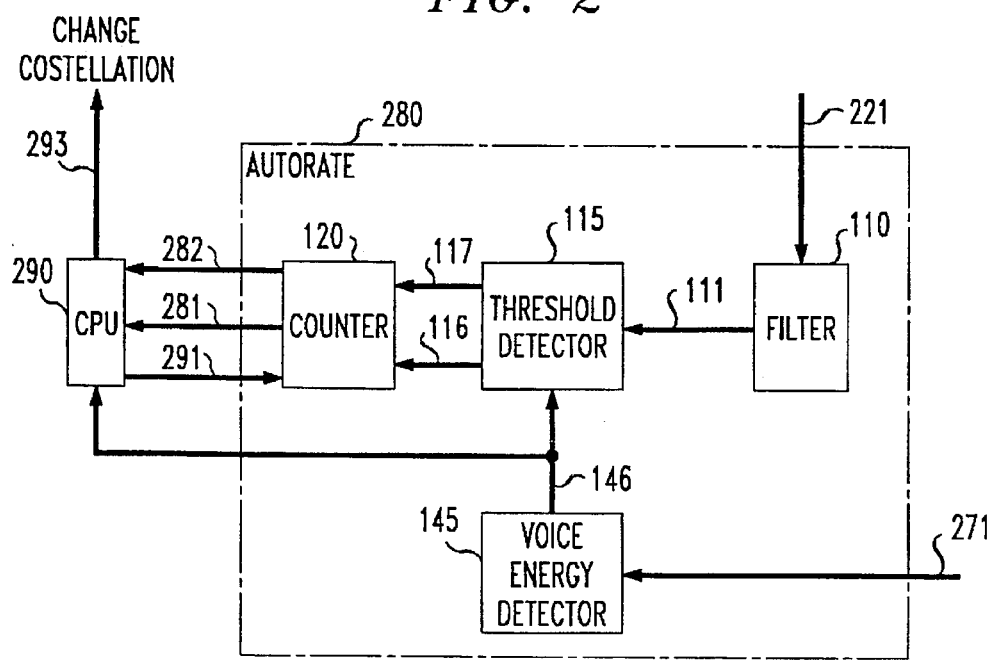
FIG. 2 shows a block diagram of autorate block 280 shown in FIG. 1.

As shown in FIG. 1, slicer 220 provides an error signal on line 221 to autorate element 280. This error signal represents the error distance between each received signal point and the closest symbol of the currently selected constellation. Turning now to FIG. 2, a more detailed block diagram of autorate element 280 is shown. The error signal from slicer 220 is applied to filter 110, which both squares and averages the error signal to generate a signal on line 111 that is proportional to the mean-squared-error (MSE). This MSE signal is applied to threshold detector 115. The latter, when operating in accordance with the invention (described below), compares the MSE signal to a predetermined low threshold and a predetermined high threshold. Threshold detector 115 provides two output signals to counter 120, the signal on line 117 representing when the MSE signal is above the high threshold, and the signal on line 118 representing when the MSE signal is below the low threshold. Counter 120 counts the number of times that either the MSE signal is above or below these predetermined thresholds and provides two rate change signals on lines 281 and 282, respectively. When the current count stored in counter 120 exceeds a predetermined high error number, counter 120 signals CPU 290 via line 281 to change the data bit rate in the "down" direction. On the other hand, when the current count stored in counter 120 exceeds a predetermined low error number, counter 120 signals CPU 290 via line 281 to change the data bit rate in the "up" direction. In response to either of these rate change signals, CPU 290 resets counter 120 via a signal on line 291, and initiates a negotiation with a far modem (not shown) in accordance with CCITT standards to change the data bit rate in the appropriate direction. In addition, once the data bit rate is changed, CPU 290 provides a signal to slicer 520 to change the selected constellation to one that provides the new data bit rate, i.e., of bits/symbol.

In addition, CPU 290 occasionally resets counter 120, via a signal on line 291, even if there is no signal, via line 281, to change the data rate. This occasional resetting of counter 120 is necessary otherwise counter 120 will continue to accumulate noise statistics and eventually signal a data rate change even though the quality of the communications channel is acceptable. For example, it can be a priori determined that noise statistics are accumulated over a one second time interval during which an enabling signal on line 46 is active (discussed below). If CPU 290 receives no data rate change signal after one second, CPU 290 then resets counter 120. On the other hand, if CPU 290 receives a data rate change signal before the one second expires, CPU 290 then restarts the measurement of the one second time interval. As mentioned above, CPU 290 only measures this one second time interval when the enabling signal on line 146 is active. Alternatively, counter 120 can be incremented or decremented in a "leaky" fashion. In particular, when the MSE signal is above a predetermined threshold, counter 120 is incremented by an amount K. However, when the MSE signal is below the predetermined amount, counter 120 is decremented by an amount J, where J<K. TMs ensures that over a long period of time counter 120 will decrement notwithstanding the presence of burst noise on the communications channel.

Figure 3:
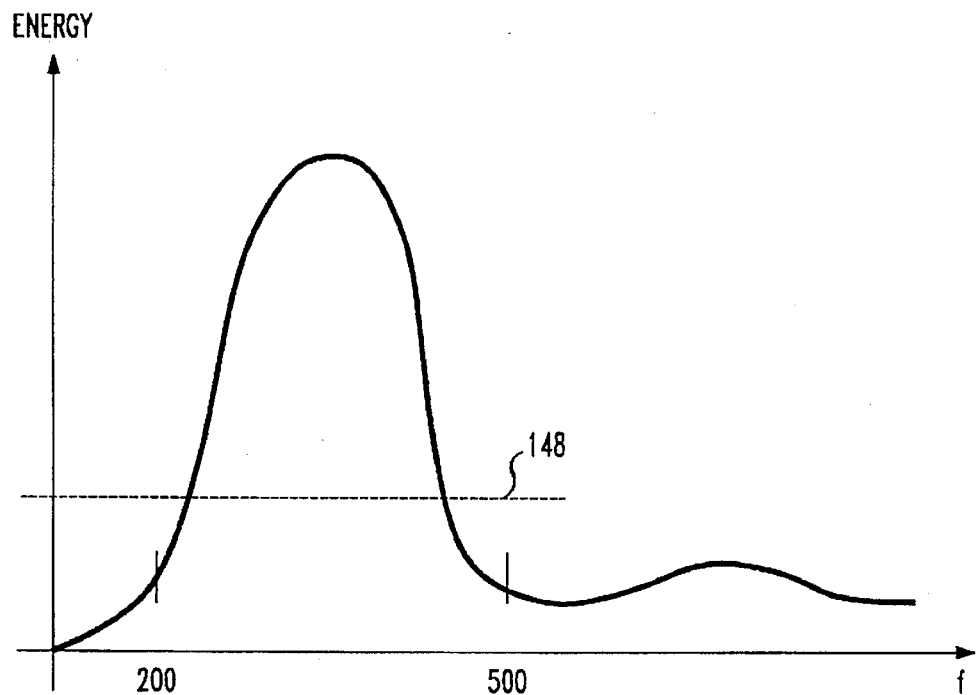
FIG. 3 illustrates a voice signal's frequency spectrum.

As noted above, and in accordance with the invention, threshold detector 115 only compares the MSE signal to a predetermined low threshold and a predetermined high threshold during a particular time interval. The particular time interval, in which threshold detector 115 operates, is under the control of voice energy detector 145. The latter receives the output of de-mapper 270 and estimates whether or not a voice signal is being received. A typical frequency spectrum of a voice signal is shown in FIG. 3. Illustratively, voice energy detector 145 comprises a simple band pass filter, which provides a signal on line 146 if the energy of the voice signal in the 200 to 500 Hz frequency range is below a predetermined amount of energy, represented by line 148 from FIG. 3. In other words, threshold detector 115 only functions when the energy of the received voice signal is low, e.g., during periods of silence. As a result, autorate element 280 estimates the amount of noise present on the communications channel only when the received voice signal comprises a small amount of energy. Consequently, any errors in the received signal are then attributed to the result of a noise signal rather than a person talking.

Figure 4:
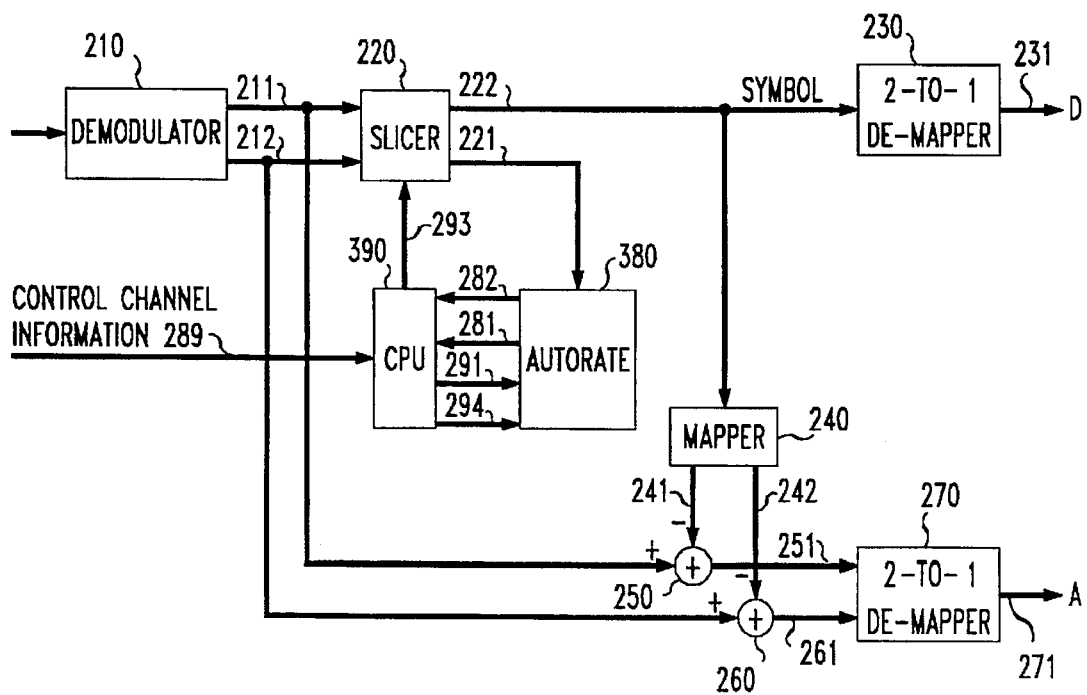
FIG. 4 shows another receiver embodying the principles of the invention.

Another embodiment of the invention is shown in FIG. 4. In this embodiment, no voice signal is applied to autorate element 380. Instead, CPU 390 receives control channel information as is known in the prior art from the far modem (not shown) via a signal on line 289. In particular, a control channel, or secondary channel, provides control and signaling information between the two modems. This secondary channel can be time division multiplexed with the data stream or use a part of the frequency spectrum. In the context of this invention, the secondary channel allows the transmitting modem to signal the receiving modem when no voice is being transmitted simultaneously with the data signal (discussed below).

Figure 5:
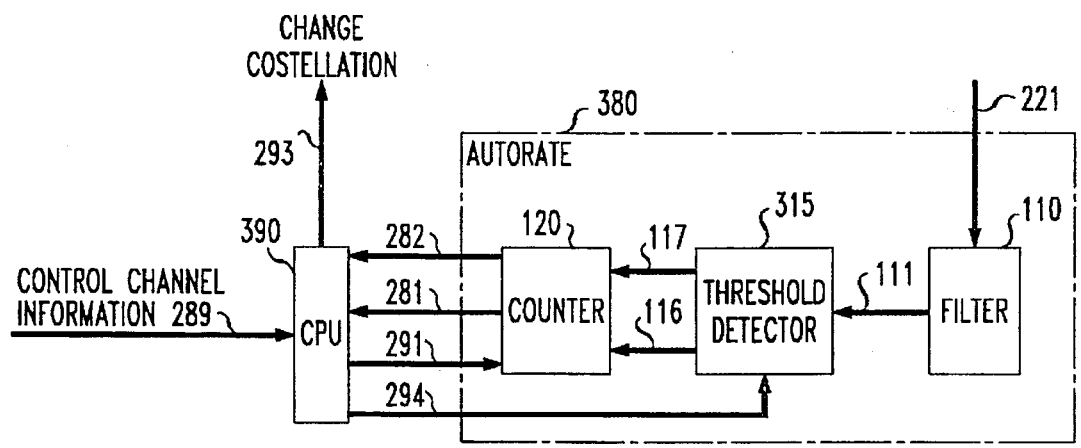
FIG. 5 shows a block diagram of autorate block 380 shown in FIG. 4.

In particular, when CPU 390 receives a message, or enabling signal, from the transmitting modem that no voice signal is being transmitted, CPU 390 enables autorate element 380 via a signal on line 294. Autorate element 380 is shown in more detail in FIG. 5 and functions in a similar fashion to autorate element 280 described above, except that the operation of threshold detector 315 is controlled by CPU 390, which is responsive to the above-mentioned enabling signal from the far modem. Otherwise, CPU 390 functions as described above.

Figure 6:
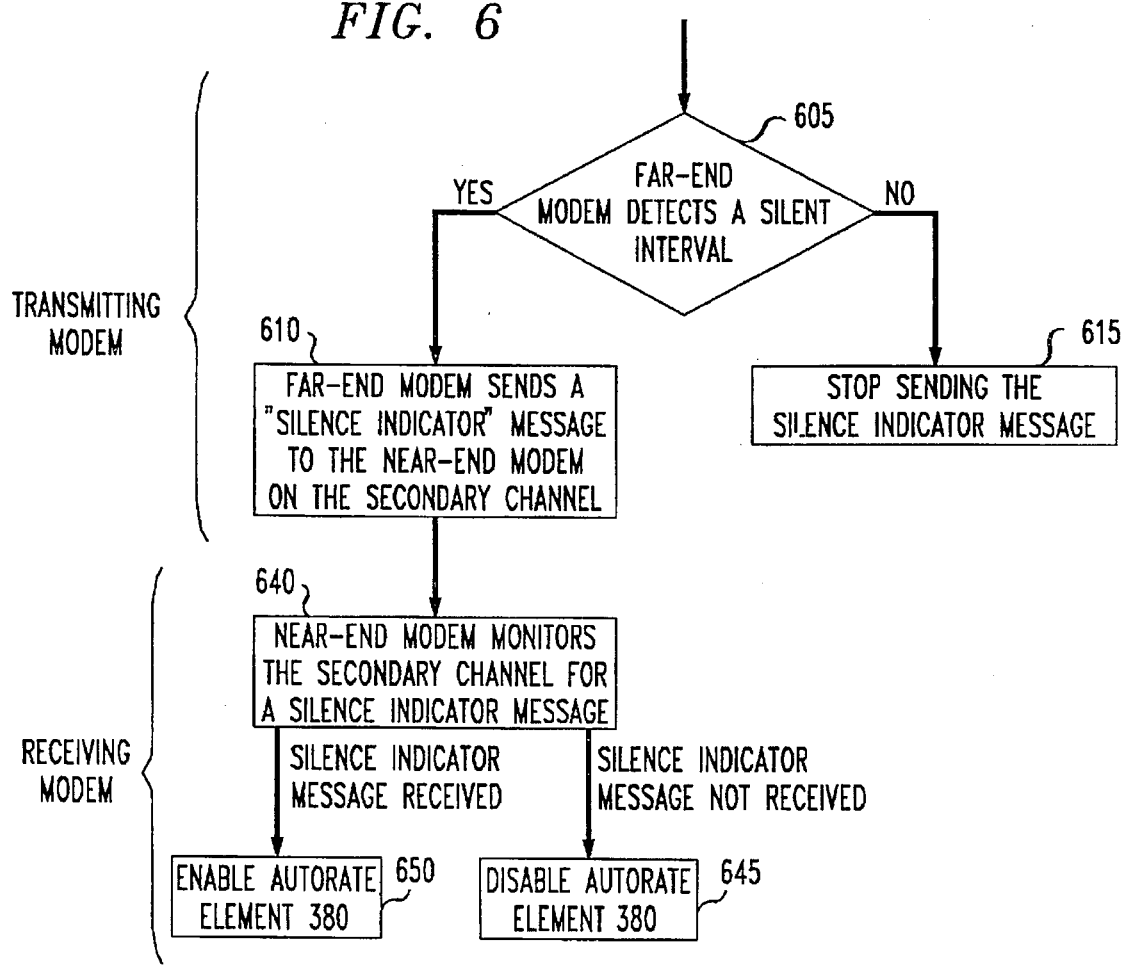
FIG. 6 illustrates a method for use in the embodiment of FIG. 4.

An illustrative method for use in conjunction with the embodiment of FIG. 4 is shown in FIG. 6. The method shown in FIG. 6 assumes a data connection between a far-end modem, which is transmitting a simultaneous voice and data signal, and a near-end modem, which is receiving the simultaneous voice and data signal. It is also assumed that a secondary channel exists as is known in the prior art for communication of signaling and control information between the far-end modem and the near-end modem. As disclosed in the above-mentioned co-pending patent application of Gordon Bremer and Kenneth D. Ko, the far-end, or transmitting, modem has access to all the information in order to make a determination of whether or not a voice signal is being communicated to the near-end, or receiving, modem. For example, in the above-mentioned co-pending patent application of Gordon Bremer and Kenneth D. Ko, a voice signal is added to the signal point coordinates of a selected data symbol. Therefore, if only the signal points corresponding to selected data symbols are being transmitted, the transmitting modem knows that no voice signal is present.

In step 605, the far-end modem monitors its transmission to detect a silence interval. If a silence interval is detected, the far-end modem transmits a "silence indicator" message to the near-end modem in step 610 on a secondary channel. However, if a silence interval is not detected, the far-end modem does not transmit the silence indicator message in step 615.

In the near-end modem, CPU 390 monitors the secondary channel for the silence indicator message in step 640. If no silence indicator message is received, CPU 390 disables autorate element 380 in step 645. However, if a silence indicator message is received, CPU 390 enables autorate element 380 in step 650. In other words, the silence indicator message enables and disables the operation of any apparatus or method that estimates the ambient noise of the communications channel.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although the invention is illustrated herein as being implemented with discrete functional building blocks, e.g., autorate element 280, etc., the functions of any one or more of those building blocks can be carried out using one or more appropriate programmed processors. In addition, the threshold values and error numbers can vary as a function of the selected constellation, i.e., data rate, and it is not limited to the use of MSE estimation. Also; other forms of voice signal detectors can be used, e.g., looking for pitch periods in the voice signal. Finally, other forms of secondary channels are also possible, e.g., dithering a signal point constellation by adding a signal point to the constellation.

We claim:

1. A method for autorating for use in data communications equipment, where the data communications equipment is coupled to a distant endpoint through a communications channel, the method comprising the steps of:

receiving a signal from the communications channel, where the signal represents a sequence of signal points;

generating an error signal that is a function of the difference between each one of the received sequence of signal points and a respective one of a number of signal points from a signal space;

evaluating the error signal during at least one time interval to provide an estimate of the ambient noise of the communications channel, where the occurrence of the at least one time interval is a function of an enabling signal;

changing the date bit rate over the communications channel as a function of said ambient noise estimate; and wherein the received signal includes portions of a data signal and a voice signal, and the enabling signal is an estimate of the presence of the voice signal in any time interval in such a way that the error signal is evaluated only when the enabling signal provides an estimate that the voice signal is not present.

2. The method of claim 1 wherein the evaluating step includes the steps of:

comparing the error signal to a first threshold;

counting the number of times the error signal exceeds the first threshold; and providing the estimate of the ambient noise when the number of times the error signal exceeds the first threshold is greater than a predetermined second threshold.

3. The method of claim 2 wherein the step of counting includes the step of resetting the count if a predetermined time interval expires before the predetermined second threshold is exceeded.

4. The method of claim 2 wherein the step of counting is performed so that over a long period of time said count of the number of times the error signal exceeds the first threshold is occasionally decremented before the count exceeds the predetermined second threshold.

5. The method of claim 1 wherein the enabling signal provides an estimate of the presence of the voice signal by comparing the energy level of the voice signal to a predetermined threshold.

6. The method of claim 1 wherein the enabling signal is representative of the occurrence of silent intervals in the voice signal.

7. The method of claim 5 further comprising the steps of:

filtering the voice signal to estimate the energy distribution of the voice signal in a first frequency range; and generating the enabling signal when the energy distribution in the first frequency range is below a predetermined threshold.

8. The method of claim 1 wherein the enabling signal is the result of a message received from the distant endpoint.

9. Apparatus for use in data communications equipment comprising:

means for demodulating a received signal from a communications channel to provide a sequence of signal points;

means for processing the sequence of signal points to provide a data signal, a voice signal, and an error signal, where the error signal represents an estimation of the deviation of each signal point of the sequence from one of a number of data symbols, where each data symbol represents a respective one of a number of reference signal points;

means for processing the error signal to provide an autorate signal; and means responsive to the autorate signal for changing the data bit rate communicated over the communications channel;

where the means for processing the error signal is enabled in at least one of a number of time intervals, K as a function of the voice signal.

10. The apparatus of claim 9 wherein the means for processing the error signal includes:

means for filtering the error signal to provide a signal representative of the mean-squared-error of said deviation;

means for comparing the signal representative of the mean-squared-error to a threshold in such a way that the autorate signal represents when the mean-squared-error exceeds the threshold a predetermined number of times within a predetermined interval; and means responsive to the voice signal for controlling the means for time comparing.

11. The apparatus of claim 10 wherein the means responsive enables the means for comparing during intervals of silence in the voice signal.

12. The apparatus of claim 11 wherein the means responsive enables the means for comparing whenever the energy of the voice signal is below a predetermined amount over a predefined frequency range.

13. Apparatus for use in data communications equipment comprising:

means for demodulating a received signal transmitted by a distant modem over a communications channel to provide a sequence of signal points;

means for processing the sequence of signal points to provide a data signal, a voice signal, and an error signal, where the error signal represents an estimation of the deviation of each signal point of the sequence from one of a number of data symbols, where each data symbol represents a respective one of a number of reference signal points;

means for processing the error signal to provide an autorate signal; and means responsive to the autorate signal for changing the data bit rate communicated over the communications channel;

where the means for processing the error signal is enabled in at least one of a number of time intervals, K, as a function of a message received from the distant modem.

14. The apparatus of claim 13 wherein the means for processing the error signal includes:

means for filtering the error signal to provide a signal representative of the mean-squared-error of said deviation;

means for comparing the signal representative of the mean-squared-error to a threshold in such a way that the autorate signal represents when the mean-squared-error exceeds the threshold a predetermined number of times within a predetermined time interval; and means responsive to the message for controlling the means for comparing.

15. The apparatus of claim 14 wherein the message from the distant modem represents intervals of silence in the voice signal.

16. A method for autorating for use in data communications equipment, the method comprising the steps of:

receiving a signal to provide a sequence of signal points;

recovering from each received signal point a data signal, an analog signal, and an error signal;

determining if the analog signal is a noise signal; and if the analog signal is the noise signal, enabling an autorate procedure.

17. The method of claim 16 wherein the determining step includes the steps of:

detecting an energy level of the analog signal;

if the detected energy level is above a predetermined amount over a predefined frequency range, determining that the analog signal is not the noise signal; and if the detected energy level is below the predetermined amount over the predefined frequency range, determining that the analog signal is the noise signal.

18. A method for autorating for use in data communications equipment, the method comprising the steps of:

receiving a signal from a far-end data communications equipment to provide a sequence of signal points;

recovering from each received signal point a data signal, an analog signal, and an error signal;

receiving a message from the far-end data communication equipment, where the message specifies if the analog signal is a noise signal; and if the analog signal is the noise signal, enabling an autorate procedure.

19. Apparatus for autorating for use in data communications equipment, the apparatus comprising:

means for receiving a signal to provide a sequence of signal points;

means for recovering from each received signal point a data signal, an analog signal, and an error signal;

means for determining if the analog signal is a noise signal; and means responsive to the determining means for controlling an autorate procedure, wherein if the analog signal is a noise signal the autorate procedure is enabled.

20. The apparatus of claim 19 wherein the means for determining includes means for detecting an energy level of the analog signal over a predetermined frequency range, wherein if the detected energy level is above a predetermined mount over the predefined frequency range, the analog signal is not the noise signal, and if the detected energy level is below the predetermined amount over the predefined frequency range, the analog signal is the noise signal.

21. Apparatus for autorating for use in dam communications equipment, the apparatus comprising:

means for receiving a signal from a far-end data communications equipment to provide a sequence of signal points;

means for recovering from each received signal point a data signal, an analog signal, and an error signal; and means responsive to a message from the far-end data communications equipment for enabling an autorate procedure when the analog signal is the noise signal.

* * * * *

UNITED STATES PATENT AND TRADEMARK OFFICE
CERTIFICATE OF CORRECTION

PATENT NO. : 5,671,250
DATED : September 23, 1997
INVENTOR(S) : Bremer, et al.

It is certified that error appears in the above-indentified patent and that said Letters Patent is hereby corrected as shown below:

In claim 21, column 8, line 34, delete "dam" and replace with --data--.

Signed and Sealed this

Third Day of February, 1998

Attest:

BRUCE LEHMAN

*Attesting Officer*   *Commissioner of Patents and Trademarks*